United States Patent [19]
Carpentier

[11] Patent Number: 5,745,585
[45] Date of Patent: Apr. 28, 1998

[54] DYNAMIC EQUALIZATION METHOD AND DEVICE

[75] Inventor: Claude Carpentier, Courbevoie, France

[73] Assignee: S L X S.A.R.L., Courbevoie, France

[21] Appl. No.: 240,700

[22] PCT Filed: Nov. 10, 1992

[86] PCT No.: PCT/FR92/01043

§ 371 Date: May 9, 1994

§ 102(e) Date: May 9, 1994

[87] PCT Pub. No.: WO93/10646

PCT Pub. Date: May 27, 1993

[30] Foreign Application Priority Data

Nov. 12, 1991 [FR] France .................. 91 13889

[51] Int. Cl.$^6$ .................................. H03G 5/00
[52] U.S. Cl. ............................ 381/103; 381/106
[58] Field of Search ............... 381/103, 98, 107, 381/119, 104, 101, 102, 106; 330/304, 302

[56] References Cited

U.S. PATENT DOCUMENTS

| | | | |
|---|---|---|---|
| 4,454,609 | 6/1984 | Kates | 381/106 |
| 4,609,878 | 9/1986 | Rodgers | 381/106 |
| 4,627,094 | 12/1986 | Scholz | 381/106 |
| 4,739,514 | 4/1988 | Short | 381/106 |
| 4,755,771 | 7/1988 | Sakaida et al. | 330/304 |
| 4,947,133 | 8/1990 | Thomas | 381/106 |
| 5,050,217 | 9/1991 | Orban | 381/106 |

OTHER PUBLICATIONS

English language Japanese Abstract for JP55021644 (Feb. 15, 1980).
English language Japanese Abstract for JP60041332 (Mar. 5, 1985).

*Primary Examiner*—Curtis Kuntz
*Assistant Examiner*—Xu Mei
*Attorney, Agent, or Firm*—Beveridge, DeGrandi, Weilacher & Young, LLP

[57] ABSTRACT

Equalization method for the amplification of audiofrequency signals that uses a first component for the correction of the response curve for the stationary mode, at least a second component for correction whose gain (GT) is different from the gain (GS) of the first correction component and for correcting the response curve in transient mode, discriminating the transient mode and switching from the first correction component to the second correction component when the transient mode is discriminated, and reverse switching after the transient mode.

11 Claims, 1 Drawing Sheet

DYNAMIC EQUALIZATION METHOD AND DEVICE

The present invention concerns an equalization method and device for audio frequency amplifiers for reproducing sound.

In the reproduction of sound, equalization is directed to obtaining either a sound balance as close as possible to the original sound by correcting defects in the linearity of the response curve of the transducer system comprising one or more loudspeakers, representing the concept of high fidelity, or a sound tailored to the taste of the listener. In the former case the function of the equalization device or equalizer is purely technical. In the latter case the equalizer serves as a sophisticated tone control.

The response curve of a loudspeaker enclosure in a room is subject to two kinds of distortion: very peaky "sawteeth" and broader undulations. At the lower end of the audible frequency spectrum these two types of distortion are combined.

The sawtooth distortion results from interaction between the direct sound wave and reflected sound waves. If the direct wave and the resultant of the reflected waves are in phase the response curve shows a peak of approximately 6 dB relative to the anechoic pressure due to the direct wave only. If the resultant of the reflected waves is 180° out of phase with the direct wave the response curve shows a dip and in theory the acoustical pressure can cancel out.

The broader undulations are due to the non-linearity of the response curve of the enclosure at the listening angle.

With known equalization devices, equalization is obtained by including permanently in the signal path bandpass filters adapted to fill in the dips of the response curve and bandstop filters adapted to remove the peaks.

This procedure gives good results for correction of undulations resulting from non-linearity of the response curve of the enclosure, but has an adverse effect when applied to the correction of peaky distortion resulting from a combination of the direct wave and the reflected waves in a room.

During investigation of transient phenomena, the applicant has discovered that the combination of the direct wave with the reflected waves occurs progressively and stabilizes only after a time period which can be up to 100 ms in an ordinary size room, for example a 100 m$^3$ living room. This effect can be called the "room effect".

A signal peak due to the audible attack of a musical instrument is always reached within the first 10 milliseconds, at which time the room effect has yet to occur. This means that only the direct wave has reached the listener.

Given that conventional equalizers process only stable phenomena, with no effect on reproduction of transient phenomena, instrumental attack whose fundamental frequency corresponds to a resonance peak that is corrected by a conventional equalizer causes the dynamic range of the signal to be cut by around 6 dB, a power ratio of 1 to 4. The same applies on correcting a dip by adjusting a frequency band using a conventional equalizer, which artificially increases the dynamic range in this frequency band.

An object of the invention is to propose an equalization method and device allowing for transient phenomena.

To be more precise, an object of the invention is an equalization method and device allowing for the room effect and preserving the original dynamic range of instrumental attack.

The present invention features an equalization method for amplification of audio frequency signals characterized in that it provides first means for correcting the response curve under stable conditions and at least one second correction means whose gain (GT) is different from the gain (GS) of the first correction means for correcting the response curve under transient conditions, discriminates transients, switches from the first correction means to the second correction means when a transient is discriminated and switches in the opposite direction after the transient.

The discrimination of the transient and the switching from the first correction means to the second correction means are preferably effected within less than 5 ms in order to react immediately by increasing the gain in the case of an attack or reducing the gain in the case of a dip.

At the end of the transient, switching occurs from the second correction means (for transient conditions) to the first correction means (for stable conditions).

The return to the first correction means (for stable conditions) is preferably effected progressively as soon as the signal stops rising and over a time period between 30 ms and 100 ms variable according to the room characteristics. A simpler approach is to effect the switching instantaneously after a short time period of between 30 ms and 100 ms relative to the transient.

The equalizer device for audio frequency amplifiers in accordance with the invention comprises first correction means for stable conditions characterized in that it further comprises at least one second correction means for transient conditions whose gain (GT) is different from the gain (GS) of the first correction means, a peak detector (O3), transient discriminator means (O4) connected to the peak detector, and means for switching from the first correction means to the second correction means and vice versa, the switching means being controlled by the discriminator means.

The device can include time-delay means for returning to the first correction means after the transient. The first and second correction means can comprise a single circuit whose gain can assume either of two values simply by switching a resistance.

The invention will be better understood from the detailed description of one embodiment by way of non-limiting example shown in the appended drawings, in which.

Figure 1:
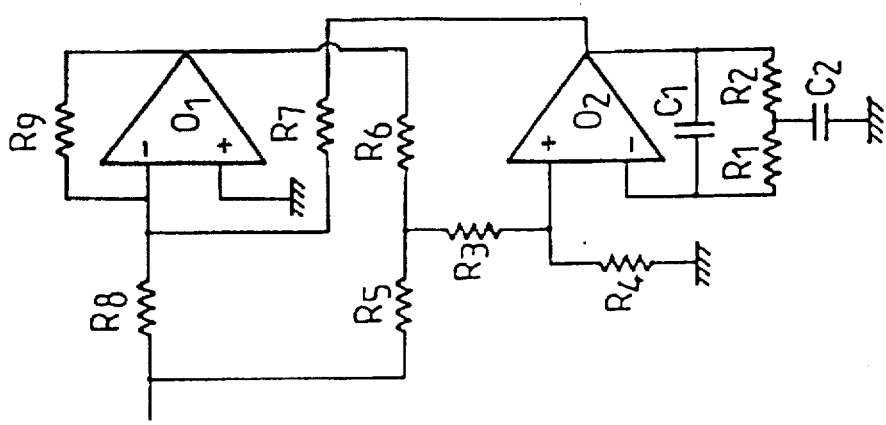
FIG. 1 is an electrical circuit schematic of a conventional equalizer.

FIG. 1 shows a known type equalizer circuit. The circuit includes an operational amplifier O2 configured as a bandpass filter with the frequency set by equal value resistors R1 and R2. The amplifier O2 is supplied via a divider bridge comprising resistors R3 and R4. A second amplifier O1 is configured as a unity gain mixer (phase-inverter).

Variable resistors R5 and R6 constitute a potentiometer system. When the value of R5 is equal to zero the output signal of the amplifier O2 is in phase with the input signal of the amplifier O1. The overall gain is then maximum at the frequency to which the amplifier O2 is tuned.

When the value of R6 is equal to zero the output signal of the amplifier O2 is 180° out of phase with the input signal of the amplifier O1. The overall gain is then minimum at the frequency to which the amplifier O2 is tuned.

If the values of R5 and R6 are equal, the voltage of the signal at the common point of the resistors R5 and R6 has a null value, which cancels the action of the operational amplifier O2.

Consequently, the gain of the bandpass filter is varied by adjusting the ratio R5/R6 and the passband is varied by adjusting the ratio R3/R4.

Figure 2:
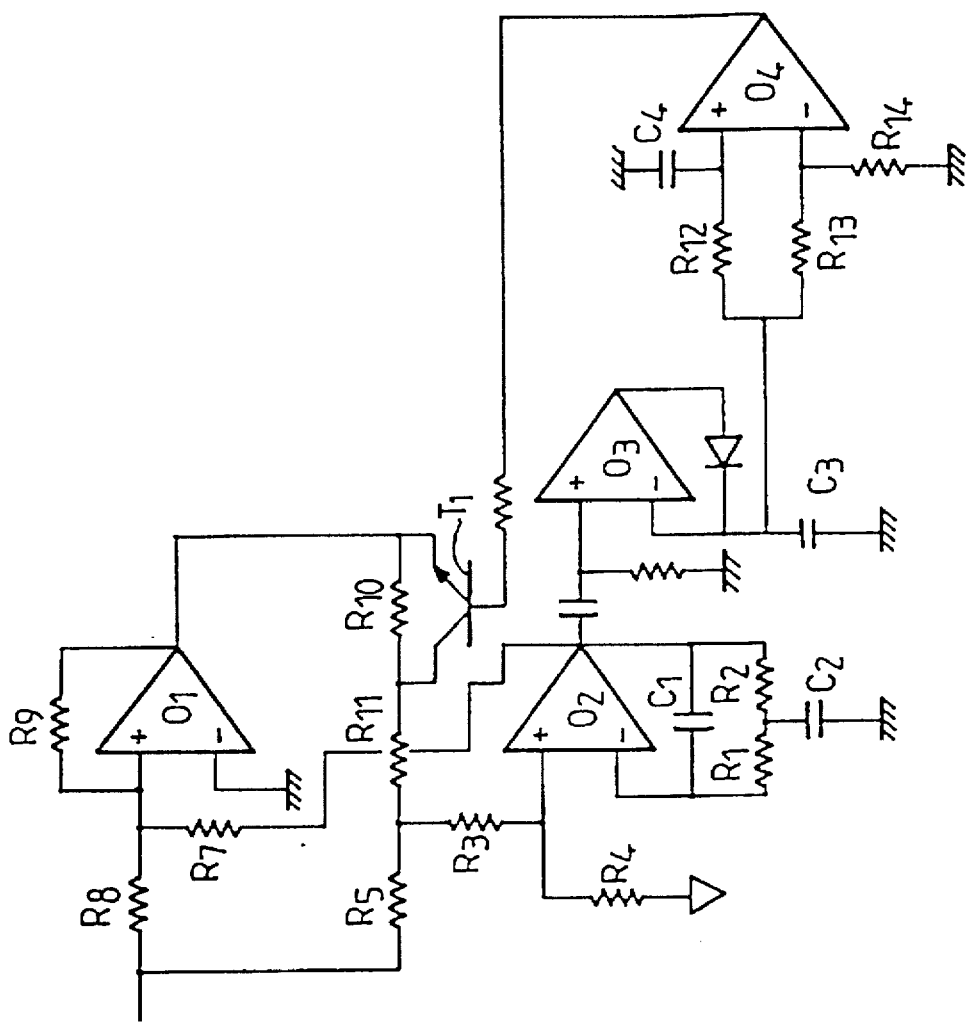
FIG. 2 is an electrical circuit schematic of an equalizer in accordance with the invention.

FIG. 2 shows an equalization device in accordance with the invention based on the electrical circuit schematic of FIG. 1. In this circuit the resistor R5 is a fixed resistor and the resistor R6 is replaced by a pair of resistors R10 and R11.

The device further comprises an NPN transistor T1, a peak detector O3 and a discriminator O4. When the transistor T1 is turned on (conducting) the resistor R10 is short-circuited.

According to the invention, by varying the respective values of the resistors R5, R10 and R11, the gain GT for transient conditions and the gain GS for stable conditions can assume all values between a maximum threshold and a minimum threshold. If the value of the resistor R10 is reduced to zero, the transistor T1 is short-circuited and the device operates in the same way as the FIG. 1 circuit.

Transient conditions are discriminated from stable conditions in the following manner. The output signal of the bandpass filter O2 is detected by the peak detector O3 connected to the discriminator O4. Under stable conditions the output of the discriminator O4 is high because the (−) input of the discriminator O4 is at a potential slightly lower than the (+) input of said discriminator because of a divider bridge comprising two resistors R13 and R14. The transistor T1 is turned on and short-circuits the resistor R10, which reduces the gain of the device. If the modulation increases suddenly, the time constant of the circuit R12/C4 causes the potential at the (−) input of the discriminator O4 to rise above the potential at the (+) input of said discriminator. The output of the discriminator O4 goes low, the consequence of which is to turn off the transistor T1. The gain of the device increases.

Switching between the two gains of the device is preferably effected by means of the discriminator at a zero-crossing of the signal. This can be accomplished by a zero-crossing detector (not shown) connected to the discriminator O4.

After the modulation of the signal rises, the potential at the (+) input of the discriminator O4 catches up with that at the (−) input of the discriminator so that its output goes high again. The transistor T1 is turned on again and the gain of the device is reduced. Reswitching of the discriminator O4 advantageously occurs after a time-delay variable between 30 ms and 100 ms.

This achieves the required result, namely dynamic equalization allowing fully for the transient. The discriminator is set up by varying the values of the capacitors C3, C4 and the resistors R12, R13 and R14.

To process a transient dip, rather than a peak, it is sufficient to replace the NPN transistor T1 with a PNP transistor to obtain a transient gain GT less than the stable gain GS using the same circuit as shown in FIG. 2.

I claim:

1. Equalizer device for an audio frequency amplifier system comprising:

first correction means for correcting a response curve of an audio frequency amplifier in said system for stable conditions, said first correction means having a gain (GS);

at least one second correction means for correcting the response curve of the audio frequency amplifier under transient conditions, said second correction means having a gain (GT) which is different from the gain (GS) of the first correction means;

a peak detector in communication with said first correction means;

transient discriminator means for discriminating a transient condition in the response curve, the transient discriminator being connected to the peak detector; and means for switching from the first correction means to the second correction means in response to the discrimination of a transient condition by the transient discriminator means, and for switching from the second correction means to the first correction after the end of the transient condition.

2. Equalizer device according to claim 1 wherein said first and second correction means are constituted by a single circuit which is arranged such that the gain of the single circuit is set to either of two values by switching in line or out of line a single resistor (R10).

3. Equalizer device according to claim 2 wherein said switching means is effected by means of a transistor (T1) controlled by the discriminator means (O4).

4. Equalizer device according to claim 1 further comprising a zero-crossing detector associated with the discriminator (O4) for effecting the switching upon a zero-crossing of a signal for the transient condition.

5. Equalizer device according to claim 1 further comprising variable time-delay means for governing a return from the second correction means to the first correction means after an end of the transient condition.

6. An equalizer device for an audio frequency amplifier system, comprising:

first correction means for correcting a response curve of the system under a stable condition and for providing a gain (GS), said first correction means having at least an operational amplifier and a plurality of resistances in line therewith;

at least one second correction means for correcting a response curve of the system under a transient condition whose gain (GT) is different from the gain (GS) of the first correcting means, said gain (GT) being provided by the short circuiting of a resistance of said first correction means;

a peak detector having a positive input terminal connected to the output terminal of said operational amplifier in said first correcting means through a capacitor and to the ground through a resistance device, a negative input terminal connected to the ground through a capacitor and an output terminal connected to said negative input terminal through a diode;

transient discriminator means for discriminating a transient condition in the response curve, said discriminator means including an input terminal connected to the negative input terminal of the operational amplifier of the peak detector, said transient discriminator means having an operational amplifier provided with a positive input terminal connected to the ground through a capacitor and to the input of said transient discriminator means through a resistance member, a negative input terminal connected to the ground through a first resistance and to the input of said transient discriminator means through a second resistance, and an output terminal;

means for switching from the first correction means to the second correction means and vice versa by short circuiting a resistance of the first correction means, the switching means being controlled by the discriminator means, the input thereof being connected to the output terminal of said operational amplifier of said transient discriminator means through a resistance.

7. An equalization method for amplification of audio frequency signals in an audio frequency system having first correction means for providing an input signal gain (GS) to correct a response curve of the system for stable conditions and at least one second correction means for providing an input signal gain (GT) which is different from the gain (GS) of the first correction means to correct the response curve under transient conditions, which method comprises:

discriminating a transient condition in the response curve;

switching from the first correction means to the second correction means when the transient condition is discriminated; and switching from the second correction means to the first correction means after an end of the transient condition.

8. Equalization method according to claim 7, wherein the detecting, discriminating and switching from the first correction means to the second correction means in the presence of a transient condition are effected within a total time of less than 5 ms.

9. Equalization method according to claim 7, wherein the switching from the second correction means to the first correction means is effected after a time-delay of between 30 ms and 100 ms from the discrimination of the transient condition.

10. Equalization method according to claim 7, wherein the switching from the second correction means to the first correction means is effected progressively after the transient condition stops increasing and in a time period of between 30 ms and 100 ms.

11. Equalization method according to claim 7, wherein the switching between the first and second correction means is effected at a zero-crossing of a signal for the transient condition.

\* \* \* \* \*